(12) United States Patent
Calvet et al.

(10) Patent No.: US 8,712,229 B2
(45) Date of Patent: Apr. 29, 2014

(54) ARCUATE MOTION CONTROL IN ELECTROSTATIC ACTUATORS

(71) Applicant: DigitalOptics Corporation MEMS, Arcadia, CA (US)

(72) Inventors: Robert J. Calvet, Arcadia, CA (US); Xiaolei Liu, Arcadia, CA (US); Roman C. Gutierrez, Arcadia, CA (US); Ankur Jain, Arcadia, CA (US); Guiqin Wang, Arcadia, CA (US)

(73) Assignee: DigitalOptics Corporatin MEMS, Arcadia, CA (US)

( * ) Notice: Subject to any disclaimer, the term of this patent is extended or adjusted under 35 U.S.C. 154(b) by 0 days.

(21) Appl. No.: 13/843,817

(22) Filed: Mar. 15, 2013

(65) Prior Publication Data

US 2013/0215325 A1 Aug. 22, 2013

Related U.S. Application Data

(63) Continuation-in-part of application No. 12/946,515, filed on Nov. 15, 2010, now Pat. No. 8,619,378, and a continuation-in-part of application No. 13/247,895, filed on Sep. 28, 2011, and a continuation-in-part of application No. 13/247,888, filed on Sep. 28, 2011, which is a continuation-in-part of application No. 12/946,670, filed on Nov. 15, 2010, and a continuation-in-part of application No. 12/946,657, filed on Nov. 15, 2010, now Pat. No. 8,608,393, and a continuation-in-part of application No. 12/946,646, filed on Nov. 15, 2010, now Pat. No. 8,430,580, application No. 13/843,817, which is a continuation-in-part of application No. 13/247,898, filed on Sep. 28, 2011, and a continuation-in-part of application No. 13/843,107, filed on Mar. 15, 2013.

(51) Int. Cl.
*G03B 17/00* (2006.01)

(52) U.S. Cl.
USPC .......................................................... 396/75

(58) Field of Classification Search
USPC .......................................................... 396/75
See application file for complete search history.

(56) References Cited

U.S. PATENT DOCUMENTS

| | | | | |
|---|---|---|---|---|
| 7,098,571 B2* | 8/2006 | Adams et al. | ................ | 310/309 |
| 8,337,103 B2* | 12/2012 | Gutierrez | ................ | 396/529 |
| 8,430,580 B2* | 4/2013 | Gutierrez et al. | ................ | 396/529 |
| 8,521,017 B2* | 8/2013 | Calvet et al. | ................ | 396/133 |
| 2009/0284816 A1* | 11/2009 | Davis et al. | ................ | 359/199.1 |
| 2012/0120297 A1* | 5/2012 | Gutierrez | ................ | 348/335 |
| 2012/0120308 A1* | 5/2012 | Gutierrez et al. | ................ | 348/374 |
| 2013/0077947 A1* | 3/2013 | Calvet et al. | ................ | 396/133 |

* cited by examiner

*Primary Examiner* — Rodney Fuller
(74) *Attorney, Agent, or Firm* — Haynes and Boone LLP (57) ABSTRACT

In one embodiment, an actuator includes a moving frame coupled to a fixed frame by a plurality of elongated parallel motion flexures for generally parallel motion relative to the fixed frame and between an as-fabricated position and a deployed position. The flexures are disposed at a first angle relative to a line extending perpendicularly to both the moving frame and the fixed frame when the moving frame is disposed in the as-fabricated position, and at a second angle relative to that same line when the moving frame is disposed in the deployed position. Arcuate movement of the first frame relative to the second frame is controlled by constraining the first angle to a value of less than about half of the sum of the first and second angles.

21 Claims, 4 Drawing Sheets

ARCUATE MOTION CONTROL IN ELECTROSTATIC ACTUATORS

CROSS-REFERENCE TO RELATED APPLICATIONS

This continuation-in-part parent application claims the benefit of and priority of U.S. patent application Ser. No. 12/946,515 filed Nov. 15, 2010 and entitled "ROTATIONAL COMB DRIVE Z-STAGE" which is hereby incorporated by reference in its entirety.

This continuation-in-part parent application claims the benefit of and priority of U.S. patent application Ser. No. 13/247,895 filed Sep. 28, 2011 and entitled "OPTICAL IMAGE STABLIZATION USING TANGENTIALLY ACTUATED MEMS DEVICE" which is hereby incorporated by reference in its entirety.

This continuation-in-part parent application claims the benefit of and priority of U.S. patent application Ser. No. 13/247,888 filed Sep. 28, 2011 and entitled "MEMS ACTUATOR DEVICE DEPLOYMENT" which is hereby incorporated by reference in its entirety.

U.S. patent application Ser. No. 13/247,888 is a continuation in part patent application and claims the benefit of and priority to U.S. patent application Ser. No. 12/946,670 entitled "LINEARLY DEPLOYED ACTUATORS", Ser. No. 12/946,657 entitled "CAPILLARY ACTUATOR DEPLOYMENT", and Ser. No. 12/946,646 entitled "ROTATIONALLY DEPLOYED ACTUATORS", all filed Nov. 15, 2010, which are hereby incorporated by reference in their entirety.

This continuation-in-part parent application claims the benefit of and priority of U.S. patent application Ser. No. 13/247,898 filed Sep. 28, 2011 and entitled "MULTIPLE DEGREE OF FREEDOM ACTUATOR" which is hereby incorporated by reference in its entirety.

This continuation-in-part parent application claims the benefit of and priority of U.S. patent application Ser. No. 13/843,107 filed Mar. 15, 2013 and entitled "MINIATURE MEMS ACTUATOR ASSEMBLIES" which is hereby incorporated by reference in its entirety.

BACKGROUND

1. Technical Field

One or more embodiments of the present invention relates to electrostatic actuators in general, and in particular for example, to methods and apparatus for controlling undesirable arcuate motion in them.

2. Related Art

Actuators for use in miniature cameras and other devices are well known. Such devices typically comprise voice coils that are used to move a lens for focusing, zooming, or optical image stabilization.

Microelectromechanical systems (MEMS) actuators are also known. Examples of MEMS actuators include electrostatic comb drives, scratch drives, and thermal drives. Microminiature electrostatic MEMS actuators can be fabricated using well known wafer-scale integrated circuit (IC) fabrication techniques, and can be used in a variety of applications. For example, electrostatic MEMS actuators can be used to move an objective lens so as to effect autofocus, zoom and image stabilization functions in miniature cameras useful in various host devices, e.g., mobile phones, computers, laptops, personal digital assistants (PDAs), surveillance cameras and the like. Accordingly, it is desirable to provide improved electrostatic MEMS actuator devices for such applications.

Electrostatic MEMS actuators are susceptible to a problem known as "arcuate motion." In particular, the comb drives of such actuators include a plurality of interdigitated fingers or teeth, portions of which are attached to a fixed stage or frame, and portions of which are attached to a moving frame. It is desirable that the teeth of the comb drives move substantially parallel to each other during operation to avoid contact, interference, "stalling," and "chattering" problems, which in turn, requires the moving frame to move substantially parallel to the fixed frame. However, due to the nature of the resilient parallel motion flexures that couple the moving frame to the fixed frame, the former necessarily experiences some second order arcuate movement relative to the latter during movement, which if not controlled, can lead to the foregoing and other problems.

Accordingly, a long-felt but as yet unsatisfied need exists for inexpensive yet reliable methods and apparatus for controlling, compensating, and/or accommodating arcuate motion in the comb drives of electrostatic actuators.

SUMMARY

In accordance with one or more embodiments of the present invention, methods and apparatus are provided for controlling arcuate motion in the comb drives of electrostatic actuators that are inexpensive, reliable and relatively easy to implement during fabrication.

In accordance with one embodiment, an actuator comprises a moving frame coupled to a fixed frame by a plurality of elongated parallel motion flexures for generally parallel motion relative to the fixed frame and between an as-fabricated position and a deployed position. The flexures are disposed at a first angle relative to a line extending perpendicularly to both the moving frame and the fixed frame when the moving frame is disposed in the as-fabricated position, and at a second angle relative to that same line when the moving frame is disposed in the deployed position. Arcuate movement of the first frame relative to the second frame is controlled by constraining the first angle to a value that is less than about half of the sum of the first and second angles.

The improved actuators are particularly well suited for making a variety of miniature lens barrels and miniature camera modules of the type used in electronic host devices, such as mobile phones, computers, laptops, personal digital assistants (PDAs), surveillance cameras and the like.

The scope of this invention is defined by the claims appended hereafter, which are incorporated into this section by reference. A more complete understanding of the features and advantages of the novel methods and apparatus for controlling arcuate motion in actuators and the methods for making and using them will be afforded to those skilled in the art by a consideration of the detailed description of some example embodiments thereof presented below, especially if such consideration is made in conjunction with the appended drawings briefly described below, in which like reference numerals are used to identify like elements illustrated in one or more of the respective figures thereof.

DETAILED DESCRIPTION

This disclosure provides various embodiments of methods and apparatus for controlling arcuate movement in the comb drives of electrostatic actuators. The methods and apparatus are reliable, inexpensive, and easily implemented during actuator fabrication.

Figure 1A:
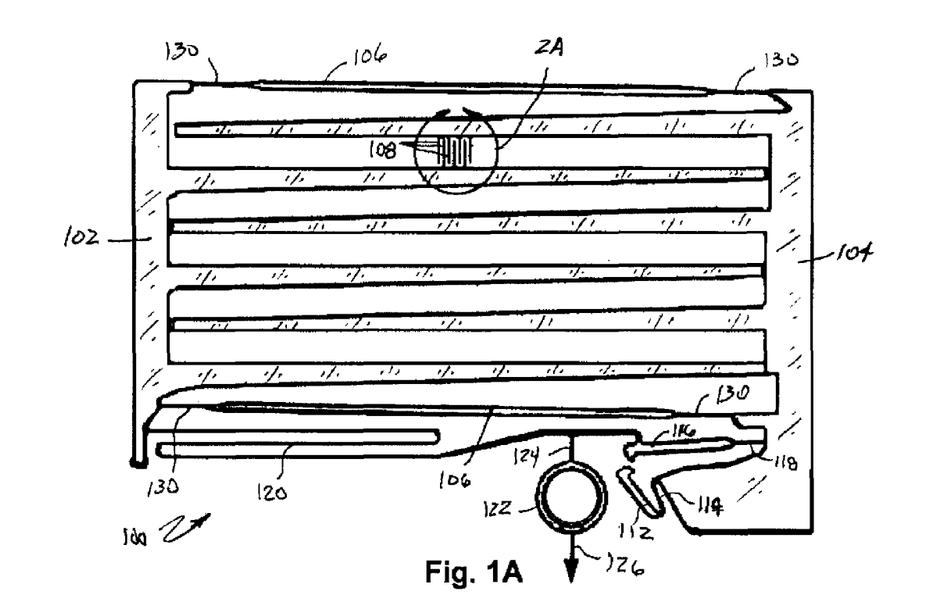
FIG. 1A is a top plan view of an example electrostatic actuator in which embodiments of the methods and apparatus of the present invention can be used advantageously, shown in an as-fabricated state and prior to its deployment for operational use.
Figure 1B:
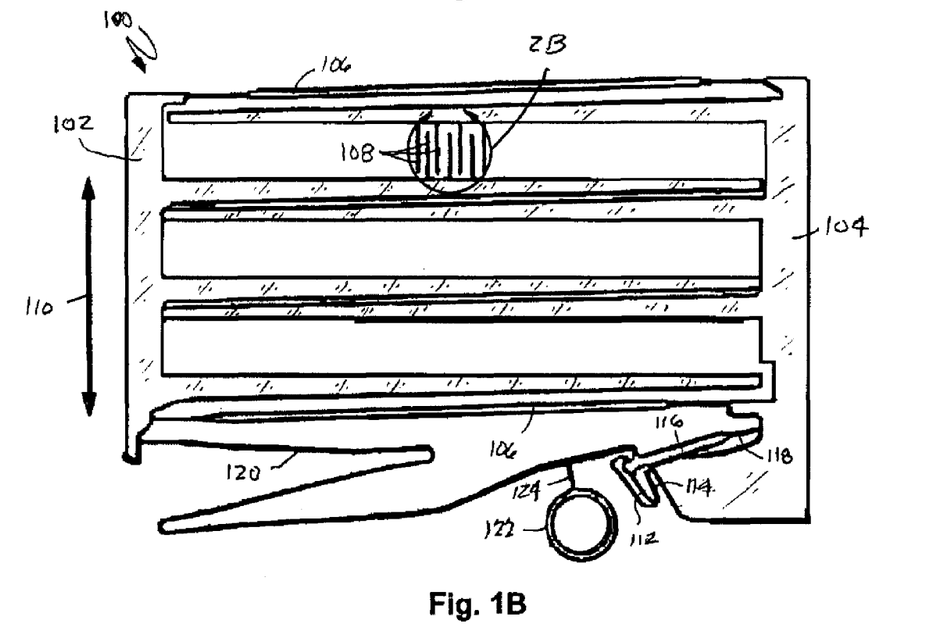
FIG. 1B is a top plan view of the example actuator device of FIG. 1A, shown after being deployed for operational use in accordance with an embodiment of the disclosure.

FIG. 1A is a top plan view of an example embodiment of an electrostatic comb drive MEMS actuator 100, shown in an as-fabricated state and prior to its "deployment" for operational use, and FIG. 1B is a top plan view of the example actuator device 100, shown after being deployed for use.

As can be seen in FIGS. 1A and 1B, a moving frame 102 is coupled to a fixed frame 104 by a pair of elongated parallel motion flexures 106 that are arranged and configured so as to enable the moving frame 102 to move substantially parallel to the fixed frame 104 in the manner of a pantograph.

As further illustrated in FIGS. 1A and 1B, each of the fixed and moving frames 104 and 102 includes an associated plurality of electrostatic comb drive "fingers" or "teeth" 108 extending perpendicularly therefrom, which are interdigitated with each other to define electrostatic comb drive "banks." When a differential actuating voltage is selectively applied to the fixed and moving frames 104 and 102 of the comb drive banks of the actuator 100, the respective teeth 108 of the fixed and moving frames 204 and 102 move perpendicularly toward or away from each other, causing the moving frame 102 to move parallel to the fixed frame 104, i.e., in the direction of the double-headed arrow 110 seen in FIG. 1B.

In the particular example embodiment illustrated in FIGS. 1A and 1B, the actuator 100 includes three electrostatic comb drive banks. However, it should be understood that the number of comb banks, as well as the number, length, width and pitch of the teeth 108 of the comb banks can vary widely, depending on the particular application at hand.

It should be further understood that, as discussed above, the interdigitated teeth 108 of the actuator 100 are shown in a "deployed" position in FIG. 1B, i.e., spread apart from one another, for substantially perpendicular, rectilinear movement relative to each other. However, as illustrated in the enlarged detail view of the teeth 108 in FIG. 2A, it may be seen that, during fabrication, e.g., on a silicon wafer and using wafer-scale photolithography techniques, the interdigitated teeth 108 of the actuator 100 are, for manufacturing reasons, initially disposed in a fully "closed" position, such that the associated fixed and moving frames 104 and 102 are spaced apart from each other by about the length of the teeth 108. Accordingly, the application of a voltage differential to the teeth 108 in this configuration would not result in any further in-plane rectilinear movement of the moving frame 102 toward the fixed frame 104. Therefore, to effect the latter type of movement, the actuator 100 must first be "deployed" into a configuration that enables this type of actuation.

In the particular example embodiment of FIGS. 1A and 1B, this deployment can include the provision of an over-center latch 112 on the fixed frame 104. The latch 112 is pivotably coupled to the fixed frame 104 with, e.g., a spring flexure 114. An elongated deployment lever 116 has an outer end pivotably coupled to the fixed frame 104 with another spring flexure 118 and an inner end coupled to an end of a recurvate deployment flexure 120. The other end of the deployment flexure 120 is coupled to the moving frame 102. The deployment lever 116 has a surface disposed at its inner end that is configured as an inclined plane for a camming actuation of, and an over-center latching engagement with, the latch 112. A pull ring 122 can be attached to the deployment flexure 120 by a spring flexure 124 disposed adjacent to the inner end of the deployment lever 116.

During deployment, a force is applied to the pull ring 122 of the actuator 110 in the direction of the arrow 126 in FIG. 1A. This causes the deployment lever 116 to rotate relative to fixed frame 104. The rotation of the deployment lever 116 causes the deployment flexure 120 to urge the moving frame 102 rectilinearly and perpendicularly away from the fixed frame 104, and to the deployed position shown in FIG. 1B, where the camming surface at the inner end of the deployment lever 116 first actuates the latch 112, i.e., causes it to pivot away from the fixed frame 104, and to then be engaged by the latch 112 so as to hold the moving frame 104 in the deployed position, as illustrated in FIG. 1B. This, in turn, results in a deployment of the teeth 108 of the moving frame 102 to the position, indicated by the phantom line 126 in the enlarged detail view of FIG. 2B, for movement relative to the teeth 108 of the fixed frame 104 in the direction indicated by the double-headed arrows 128 in FIG. 2B. The deployment lever 116 can then be fixed permanently, e.g., with an adhesive, to the latch 112 to prevent the moving frame 102 and associated moving teeth 108 from returning to their previous, "un-deployed" position shown in FIG. 1A as a result of, e.g., vibration or shock acting on the actuator device 200.

Figure 3:
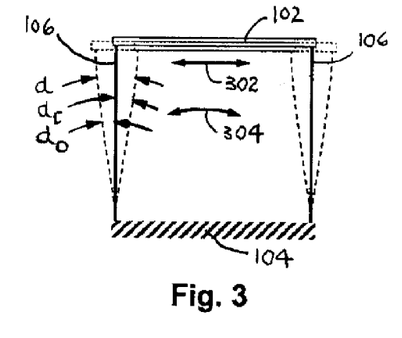
FIG. 3 is a diagrammatic illustration of a moving frame of an actuator that is moving relative to a fixed frame thereof with first order parallel motion and second order arcuate movement in accordance with an embodiment of the disclosure.

FIG. 3 is a diagrammatic illustration of the trajectory of movement of the moving frame 102 of the actuator 100 relative to the fixed frame 104, as constrained by the two parallel motion flexures 106. As can be seen in FIGS. 1A and 1B, each of the flexures 106 comprises an elongated bar or rod having opposite ends respectively hinged by "solid hinges" 130 to the fixed and moving frames 102 and 104 for arcuate movement relative to the fixed frame 104. The parallel motion flexures 106 can be approximated as linear springs, and the aspect ratio of their longitudinal vs. transversal dimensions, as well as their respective stiffnesses in those directions, is so large that they can be considered to be substantially rigid in the radial direction of the arcuate trajectory, i.e., the motion of the moving stage 102 will follow the arcuate trajectory of the flexures 106 rigidly.

Figure 2A:
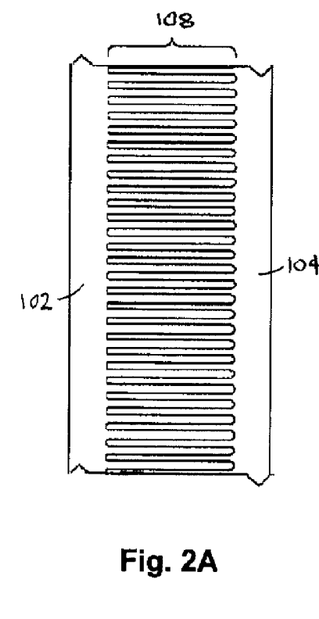
FIG. 2A is an enlarged partial detail view of fixed and moving frames and associated portions of interdigitated teeth of the example actuator of FIG. 1A, showing the relative position of the frames and teeth prior to deployment in accordance with an embodiment of the disclosure.
Figure 2B:
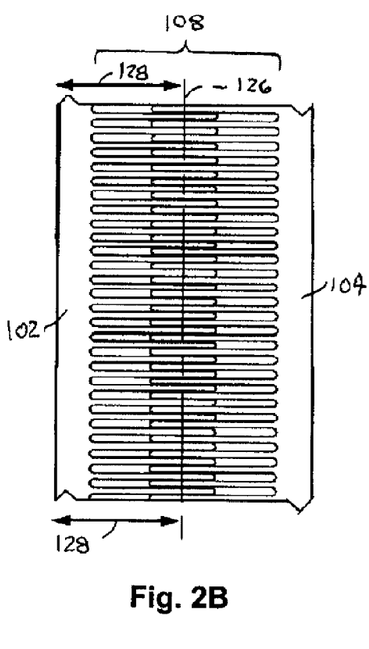
FIG. 2B is an enlarged partial detail plan view of the fixed and moving frames and associated portions of interdigitated teeth of the example actuator of FIG. 2B, showing the relative position of the frames and teeth after deployment in accordance with an embodiment of the disclosure.

As illustrated in FIG. 3, as a result of the foregoing arrangement, the in-plane motion of the moving frame 102 relative to the fixed frame 106 will include two components, viz., the desired, first order parallel motion, as indicated by the double-headed arrow 302, and an undesirable, second order arcuate component, as indicated by the double-headed arrow 304. The arcuate component 304 manifests itself as a lateral movement of the teeth 108 of the moving frame 102 relative to the teeth 108 of the fixed frame 104, i.e., in the X direction of FIG. 4. Additionally, as illustrated in FIG. 3, each of the flexures 106 traverses an angular are of $\alpha = \alpha_C + \alpha_O$ in moving from the fully closed, or as-fabricated position of the teeth 108, as illustrated in FIG. 2A, to the fully open, or deployed position, as illustrated in FIG. 2B, as measured relative to a position of the flexures 106 that is perpendicular to both the fixed and moving frames 102 and 104, as illustrated in FIG. 3.

As discussed above, even very small relative lateral motions of the teeth 108 can adversely affect the performance of an electrostatic actuator, both in terms of the so-called "transduction coefficient," i.e., the ratio of the applied actuation voltage to the resulting longitudinal force acting on the moving frame, and the "snap-in" effect, i.e., the tendency of the interdigitated teeth 108 to snap into contact with each other when energized and placed in sufficiently close proximity, which can result in shorting of the teeth and a "stall" of the actuator, or a "chatter" of the teeth 108 as the electrostatic control system of the actuator oscillates between on and off. In various embodiments, sufficient lateral displacement may introduce a friction force that opposes longitudinal actuation, even if significant snap-in does not occur.

In some embodiments, a "stall" of the actuator may occur when the longitudinal force of the actuator, which is developed by a voltage difference between the frames, is less than the spring force of the parallel flexures and/or deployment flexures being applied in a direction opposite to the longitudinal force. For example, the longitudinal force may be dependent on the lateral displacement of the moving frame and/or teeth of an electrostatic drive of the actuator (e.g., as shown in FIGS. 2A and 2B), such that lateral displacement reduces the longitudinal force developed by a particular voltage, and reduces it by increasing amounts as the teeth increasingly overlap (e.g., move towards the closed position illustrated in FIG. 2A).

In general, because the detrimental effects of lateral displacement increase as the teeth near full insertion, a design feature may be to adapt embodiments of the present disclosure to minimize such lateral displacement (e.g., so that adjacent teeth are close to equidistant from each other throughout the comb drive) when the teeth and/or frames are near the full insertion position (e.g., FIG. 2A), for example, and/or at the longitudinal position corresponding to the highest applied voltage. As such, it is contemplated that embodiments of the present disclosure may be adapted to shape a transduction curve of the actuator (e.g., a curve representing the responsiveness of the actuator to applied voltage, as a function of longitudinal distance and/or travel of the actuator) according to a particular application need. In some embodiments, such shaping may include fabricating an actuator according to one or more parallel flexure fabrication angles (e.g., measured away from perpendicular to the adjoining frame and/or frames, where a fabrication angle relative to the fixed frame may be different from the fabrication angle relative to the moving frame, for example), and/or according to a particular desired lateral displacement (e.g., measured between adjacent teeth relative to an equidistant position) at a deployment and/or fabrication position, for example. In various embodiments, shaping such transduction curve may be commensurate with shaping an arcuate trajectory of the actuator, as described herein.

A general understanding of the interrelationship of the longitudinal displacement, lateral displacement, applied voltage difference, and the spring force of the various flexures, may be derived from the following equation for the potential energy in a typical comb drive:

$$E = -N\varepsilon t(L-y)\frac{g}{g^2-x^2}V^2 + \frac{1}{2}k_y(y-y_0)^2$$

Where the various symbols can be understood from the following table:

| Symbol | Explanation |
| --- | --- |
| L | Finger length |
| g | Finger gap |
| ε | Permittivity of air |
| t | Device thickness |
| V | Voltage |
| N | Number of teeth pairs |
| x | Arcuate trajectory |
| y | Travel displacement |
| $y_0$ | Deployment distance |
| $k_y$ | Restoring force spring constant |

Figure 4:
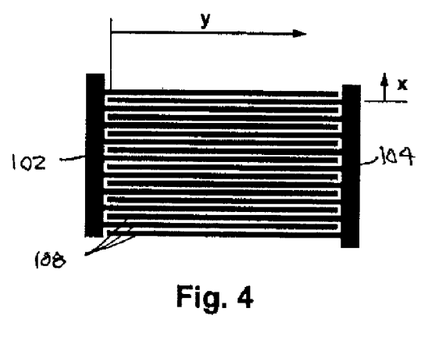
FIG. 4 is an enlarged partial detail view similar to FIG. 2A, showing the fixed and moving frames and associated portions of interdigitated teeth of the example actuator of FIG. 1B, showing the direction of movement of the moving frame relative to the fixed frame during a closing stroke in one mode of operation in accordance with an embodiment of the disclosure.

As illustrated in FIG. 4, in one example embodiment, if it assumed that the actuator has an "opening stroke," i.e., the length of movement of the moving frame 102 from the fully open or deployed position to the fully closed position, of about 130μ (130 microns, or 130×10⁻⁶ meters) in the y direction, and that the length of the parallel motion flexures 106 is about 2.5 millimeters (mm), then deflection of the moving teeth 108 relative to the fixed teeth 108 in the lateral or x direction in FIG. 4 of only about 0.2μ (i.e., a stroke length/lateral deflection ratio of about 650/1) will adversely affect actuator performance.

Figure 5:
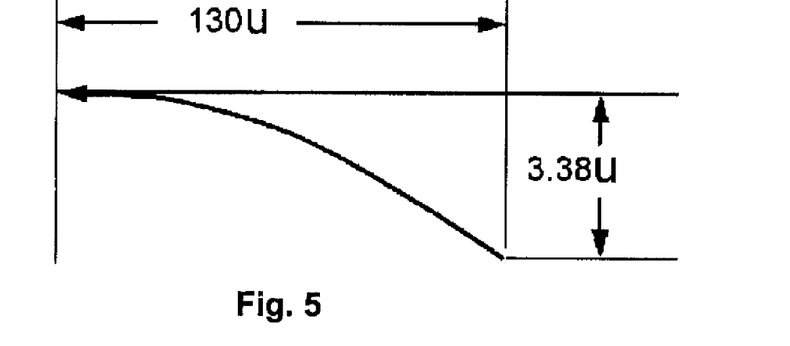
FIG. 5 is a graph of the lateral displacement of the moving frame of an example actuator versus its longitudinal displacement during a full stroke of the actuator in accordance with an embodiment of the disclosure.

It is known that, by using the longest possible flexures 106, the arcuate motion is generally minimized. However, it has been discovered empirically that by manufacturing the flexures 106 at a non-zero fabrication angle $\alpha_C$, the arcuate motion of the moving frame 102 can be greatly reduced in a region of interest, at the expense of a larger arcuate motion in less critical areas. Thus, in the example above, if the flexures 106 are fabricated in the vertical position illustrated by the solid line in FIG. 3, then the arcuate motion of the moving frame 102 will be as illustrated in FIG. 5 in moving from the fully open or deployed position (right end of the graph) to the fully closed position (left end of the graph). As can be seen in FIG. 5, the total lateral deflection of the moving frame 102, and hence, the teeth 108 associated with it, will be about 3.38μ. Since 3.38μ is larger than the gap between the teeth 108 in this example embodiment, the teeth 108 of the actuator will interfere with each other, and accordingly, a full range of motion of y=130 mm is not possible.

If the flexures 106 are fabricated at an angle $\alpha_C$ of about half the angle $\alpha$ that the full stroke would require, i.e., $\alpha_C=\frac{1}{2}\alpha$, then the arcuate motion would be as illustrated in the graph of FIG. 5. Here, the moving frame 102 can now physically travel through its full range of motion of y=130 mm, but the large lateral motion of about 0.85μ will still adversely affect the transduction coefficient, and hence the performance, of the example actuator. In fact, an actuator with this example configuration would "stall" partway through its full range of travel.

Figure 7:
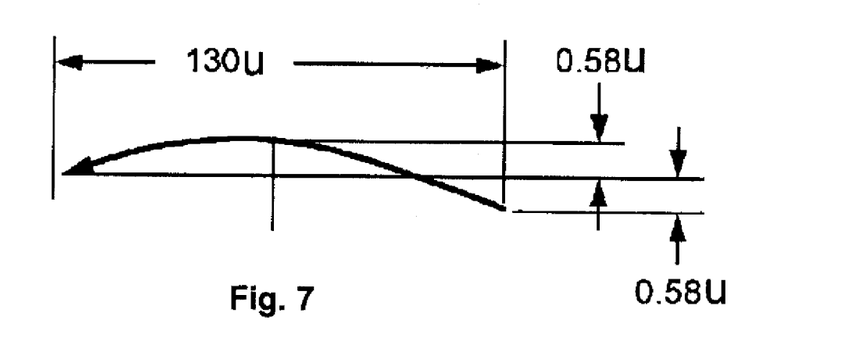
FIG. 7 is a graph of the lateral displacement of the moving frame of an actuator configured in accordance with one or more embodiments of the present invention versus its longitudinal displacement during a full stroke of the actuator in accordance with an embodiment of the disclosure.

However, if the flexures 106 in the example embodiment above are fabricated at an angle $\alpha_C$ that is less than half of the full-range travel $\alpha$, and in particular, at an angle of $\alpha_C \approx 0.415\alpha$, the arcuate motion of the moving frame 102 will be as depicted in the graph of FIG. 7. As can be seen in FIG. 7, the lateral displacement of the frame 102 is balanced to either side of the nominal gap between the teeth 108, i.e., about 0.58μ on either side, thereby providing the minimum lateral deflection for a given flexure length and stroke.

Figure 6:
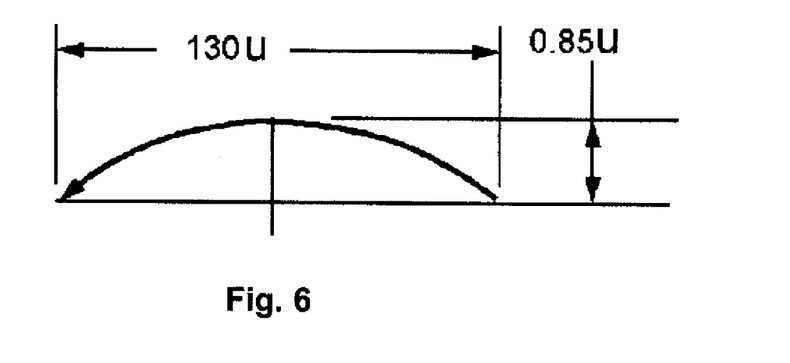
FIG. 6 is a graph of the lateral displacement of the moving frame of another example actuator versus its longitudinal displacement during a full stroke of the actuator in accordance with an embodiment of the disclosure.

As those of some skill will understand, other optima are also possible. For example, since the right side portion of the curves of FIGS. 5-7 represent the "lower actuation voltage" side, i.e., when the teeth 108 are disposed in their relatively un-energized open or deployed positions, even more lateral deviation might be tolerable. In such a case, a different fraction of the full-range angle $\alpha$ could be used for the as-fabricated angle $\alpha_C$ of the flexures 106, as discussed in the following example.

Figure 8:
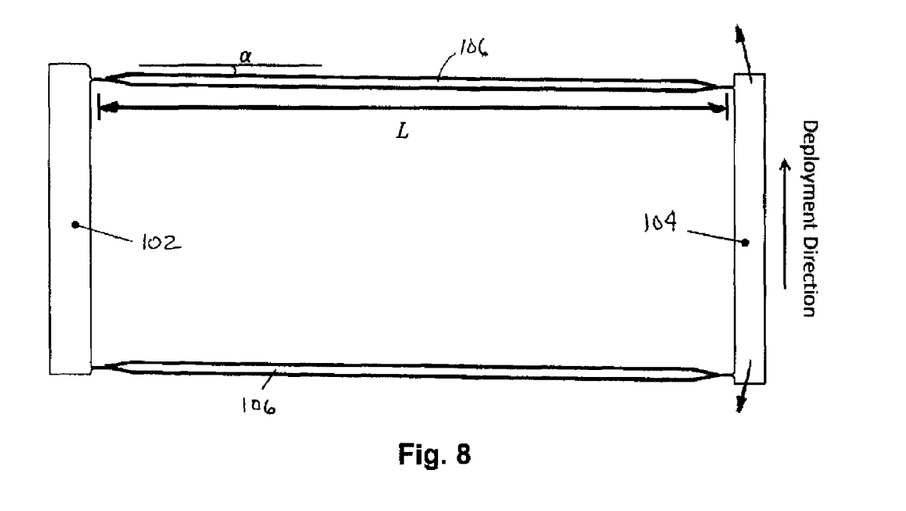
FIG. 8 is a schematic top plan view of an example electrostatic actuator in which the teeth and associated frame portions have been omitted, showing a moving frame coupled to a fixed frame by a pair of parallel motion flexures in accordance with an embodiment of the disclosure.

FIG. 8 is a schematic plan view of another example electrostatic actuator 100 in which the teeth 108 and associated portions of the moving and fixed frames 102 and 104 have been omitted for purposes illustration. The relevant parameters assumed for this particular example embodiment are given in the following table:

| Parameter | Value |
|---|---|
| Flexure length - L | 3.184 mm |
| As fabricated angle - $\alpha_C$ | 0.689 degrees |
| Deployed angle - $\alpha_O$ | 1.488 degrees |
| Total angle - $\alpha = \alpha_C + \alpha_O$ | 2.177 degrees |
| Deployment Distance - Y | 0.120 mm |
| Usable Travel Distance | 0.1 mm |

Figure 9:
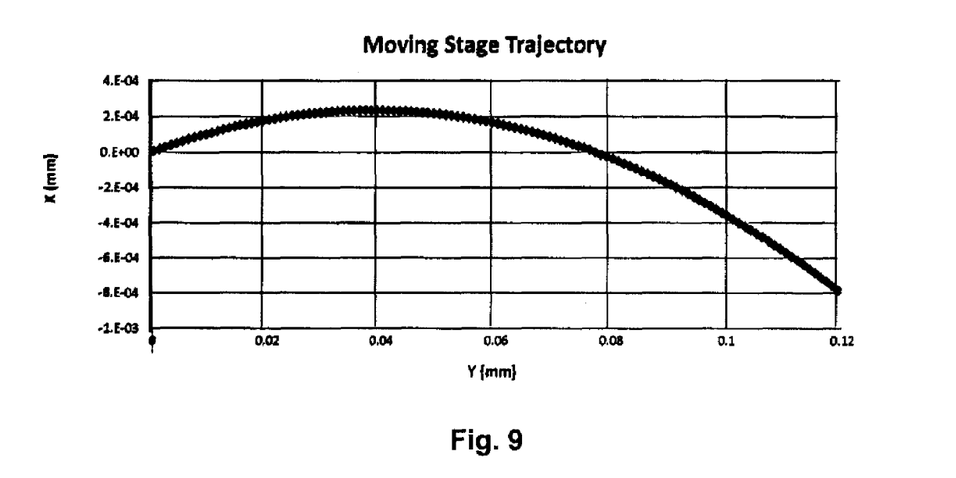
FIG. 9 is a graph similar to FIG. 7, showing the lateral displacement of the moving frame of another example actuator configured in accordance with one or more embodiments of the present invention versus its longitudinal displacement during a full stroke of the actuator.

As can be determined from the table, the as-fabricated or closed angle $\alpha_C$ is about 0.32 times the full stroke angle $\alpha$. This results in the arcuate motion of the moving frame 102 illustrated in FIG. 9, wherein it can be seen that the maximum negative lateral displacement of about $-8\times10^{-4}$ mm occurs at the open, or "lower voltage," position of the teeth 108 described above, and that the largest maximum positive lateral displacement of about $+2.1\times10^{-4}$, which is about a fourth of the maximum negative displacement, occurs at a displacement of about two-thirds of the full stroke length Y=0.120 mm. Thus, it can be seen from the foregoing that, by fabricating the parallel flexures 106 at an angle $\alpha_C$ relative to the conventional as-fabricated perpendicular position illustrated in FIG. 3 that is less than about half of the total angular deflection $\alpha$ of the flexures 106 during a full stroke, and in particular, at an angle that is between about 0.32 and about 0.42 times that angle, the arcuate motion of the moving frame 102 can be greatly reduced in critical, or higher actuation-voltage regions of its stroke, at the expense of a larger arcuate motion in less critical, i.e., lower actuation-voltage areas in which it can be more easily tolerated.

The example moving frame 102 X-Y displacement curve of FIG. 7 is not amenable to a closed term mathematical expression, but can be closely approximated by curve-fitting techniques. Thus, If (X, Y) is the displacement of the moving frame 102 from the deployed position to the as-fabricated position, then the trajectory of the frame can be can be described by the first five terms of a Taylor expansion:

$$X = a_0 + a_1 Y + a_2 Y^2 + a_3 Y^3 + a_4 Y^4,$$

where the parameters $a_0$-$a_4$ have the values listed in the following table:

| Parameter | Value |
|---|---|
| $a_0$ | −0.00371 |
| $a_1$ | 0.000586 |
| $a_2$ | −0.1561 |
| $a_3$ | 0.012057 |
| $a_4$ | $3.99 \times 10^{-6}$ |

In various embodiments of the present disclosure, similar methodologies may be utilized with other types of motion-defining flexures other than the parallel motion flexures described herein. In addition, other modifications are contemplated. For example, in some embodiments, a fabrication position may be any position between and/or including a deployment position (e.g., FIG. 2B) and a fully closed position (e.g., FIG. 2A).

In light of the foregoing description, it should be clear that many modifications, substitutions and variations can be made in and to the methods and apparatus of the present disclosure for controlling arcuate motion in electrostatic actuators, and in light of this, that the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An actuator, comprising:
   a moving frame coupled to a fixed frame by a plurality of elongated parallel motion flexures for generally parallel motion relative to the fixed frame and between an as-fabricated position and a deployed position,
   the flexures being disposed at a first angle relative to a line extending perpendicularly to both the moving frame and the fixed frame when the moving frame is disposed in the as-fabricated position, and at a second angle relative to that same line when the moving frame is disposed in the deployed position,
   wherein the first angle is less than about half of the sum of the first and second angles.

2. The actuator of claim 1, wherein the first angle is between about 0.32 and about 0.42 times the sum of the first and second angles.

3. The actuator of claim 1, further comprising a plurality of interdigitated teeth, a fixed portion of which is attached to the fixed frame and a moving portion of which is attached to the moving frame.

4. The actuator of claim 1, wherein the moving frame, the fixed frame and the parallel motion flexures are each generally planar in configuration and are disposed generally coplanar with each other.

5. The actuator of claim 3, wherein the moving frame, the fixed frame, the parallel motion flexures and the teeth are fabricated as a single monolithic piece from a silicon wafer using photolithographic techniques.

6. The actuator of claim 1, further comprising a mechanism for:
urging the moving frame from the as-fabricated position to the deployed position; and
holding the moving frame at the deployed position.

7. A miniature camera incorporating the actuator of claim 1.

8. An electronic device incorporating the miniature camera of claim 7.

9. The electronic device of claim 8, wherein the electronic device comprises a mobile phone, a computer, a laptop, a personal digital assistant (PDA) or a surveillance camera.

10. A method, comprising:
providing an actuator configured to control arcuate motion in the actuator, wherein:
the actuator is of a type that includes a moving frame coupled to a fixed frame by at least two elongated parallel motion flexures for generally parallel motion relative to the fixed frame and between a fully closed position and a fully open position, and
the at least two flexures are disposed at a first angle relative to a line extending perpendicularly to both the moving frame and the fixed frame when the moving frame is disposed in the fully closed position, and at a second angle relative to that same line when the moving frame is disposed in the fully open position; and
confining the first angle to a value that results in a minimum lateral displacement of the moving frame at the closed position.

11. The method of claim 10, wherein the confining comprises a value that results in a maximum lateral displacement of the moving frame at the fully open position and an intermediate lateral displacement of the moving frame that is less than the maximum lateral displacement and greater than the minimum lateral displacement when the moving frame is disposed at a position between the fully open and the fully closed positions.

12. The method of claim 11, wherein the method comprises confining the first angle to a value that results in the intermediate lateral displacement being about a fourth of the maximum lateral displacement when the moving frame is disposed at a position that is about two-thirds of the distance between the fully open and the fully closed positions.

13. The method of claim 10, wherein the method further comprises confining the first angle to a value that results in a maximum lateral displacement of the moving frame when a minimum actuation voltage is being applied to the fixed and moving frames, a minimum lateral displacement of the moving frame when a maximum actuation voltage is being applied to the fixed and moving frames, and an intermediate lateral displacement of the moving frame that is less than the maximum lateral displacement and greater than the minimum lateral displacement when an intermediate actuation voltage that is less than the maximum actuation voltage and greater than the minimum actuation voltage is being applied to the fixed and moving frames.

14. The method of claim 10, wherein the method comprises confining the first angle to value that is less than about half of the sum of the first and second angles.

15. The method of claim 10, wherein the method comprises confining the first angle to a value that is between about 0.32 and about 0.42 times the sum of the first and second angles.

16. A method for making an actuator, the method comprising:
forming a generally planar moving frame and a generally planar fixed frame; and
coupling the moving frame to the fixed frame with a plurality of elongated, generally planar flexures such that:
the moving frame is moveable with generally coplanar, parallel motion relative to the fixed frame and between first and second positions;
the flexures are disposed at a first angle relative to a line extending perpendicularly to both the moving frame and the fixed frame when the moving frame is disposed in the first position, and at a second angle relative to that same line when the moving frame is disposed in the second position; and
the first angle is less than about half of the sum of the first and second angles.

17. The method of claim 16, wherein the first angle is between about 0.32 and about 0.42 times the sum of the first and second angles.

18. The method of claim 16, wherein the forming farther comprises forming respective pluralities of teeth on the fixed frame and the moving frame, the teeth being arranged interdigitally with each other and to move generally parallel to each other with movement of the moving frame relative to the fixed frame.

19. The method of claim 16, wherein the forming further comprises forming a generally planar mechanism on the fixed frame and the moving frame for displacing the moving frame from the first position to the second position and for retaining the moving frame in the second position.

20. A miniature camera incorporating the actuator of claim 16.

21. An electronic device incorporating the miniature camera of claim 20.

* * * * *

UNITED STATES PATENT AND TRADEMARK OFFICE
CERTIFICATE OF CORRECTION

PATENT NO.       : 8,712,229 B2
APPLICATION NO.  : 13/843817
DATED            : April 29, 2014
INVENTOR(S)      : Robert J. Calvet et al.

It is certified that error appears in the above-identified patent and that said Letters Patent is hereby corrected as shown below:

In the Specification

In column 5 line 32, change the word "are" to -- arc --.

In the Claims

In column 10 line 40, change the word "farther" to -- further --.

Signed and Sealed this
First Day of July, 2014

Michelle K. Lee
*Deputy Director of the United States Patent and Trademark Office*